(12) United States Patent
Darwish et al.

(10) Patent No.: US 7,910,439 B2
(45) Date of Patent: Mar. 22, 2011

(54) SUPER SELF-ALIGNED TRENCH MOSFET DEVICES, METHODS, AND SYSTEMS

(75) Inventors: Mohamed N. Darwish, Campbell, CA (US); Jun Zeng, Torrance, CA (US)

(73) Assignee: Maxpower Semiconductor Inc., Santa Clara, CA (US)

( * ) Notice: Subject to any disclaimer, the term of this patent is extended or adjusted under 35 U.S.C. 154(b) by 0 days.

(21) Appl. No.: 12/392,131

(22) Filed: Feb. 25, 2009

(65) Prior Publication Data
US 2009/0309156 A1 Dec. 17, 2009

Related U.S. Application Data

(60) Provisional application No. 61/060,488, filed on Jun. 11, 2008.

(51) Int. Cl.
*H01L 21/336* (2006.01)
(52) U.S. Cl. ......... 438/270; 438/197; 438/268; 438/299
(58) Field of Classification Search ........................ None
See application file for complete search history.

(56) References Cited

U.S. PATENT DOCUMENTS

| | | | |
|---|---|---|---|
| 4,967,245 A | 10/1990 | Cogan et al. | |
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi et al. | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,413,822 B2 * | 7/2002 | Williams et al. | 438/270 |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 6,921,939 B2 | 7/2005 | Zeng | |
| 7,345,342 B2 * | 3/2008 | Challa et al. | 257/341 |
| 7,592,228 B2 * | 9/2009 | Williams et al. | 438/270 |
| 2001/0041407 A1 | 11/2001 | Brown | |
| 2003/0203576 A1 | 10/2003 | Kitada et al. | |
| 2006/0060916 A1 | 3/2006 | Girdhar et al. | |

(Continued)

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

(Continued)

*Primary Examiner* — Scott B Geyer
(74) *Attorney, Agent, or Firm* — Groover & Associates

(57) ABSTRACT

A manufacturing process and design structure for a super self-aligned trench power MOSFET. A plurality of super self-aligned trenches of different depths are formed into the body layer and epitaxial layers, preferably by using a multi-layer stack of dielectric material etched to form spacers. Respective trenches contain gate conductors, body-contact conductors, and preferably a third trench containing a recessed field plate. This results in a MOSFET structure having high cell density and low gate charges and gate-drain charges.

20 Claims, 16 Drawing Sheets

Super self-aligned Trench MOSFET

U.S. PATENT DOCUMENTS

| | | | |
|---|---|---|---|
| 2006/0267088 A1 | 11/2006 | Sharp et al. | |
| 2006/0267090 A1 | 11/2006 | Sapp et al. | |
| 2007/0117329 A1 | 5/2007 | Inagawa et al. | |
| 2007/0155104 A1* | 7/2007 | Marchant et al. | 438/270 |
| 2007/0267672 A1* | 11/2007 | Hokomoto et al. | 257/301 |
| 2008/0073707 A1 | 3/2008 | Darwish | |
| 2008/0246081 A1* | 10/2008 | Li et al. | 257/331 |
| 2009/0008709 A1* | 1/2009 | Yedinak et al. | 257/331 |

OTHER PUBLICATIONS

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

The International Search Report and the Written Opinion of the International Searching Authority, PCT/US2009/03073, Sep. 29, 2009.

* cited by examiner

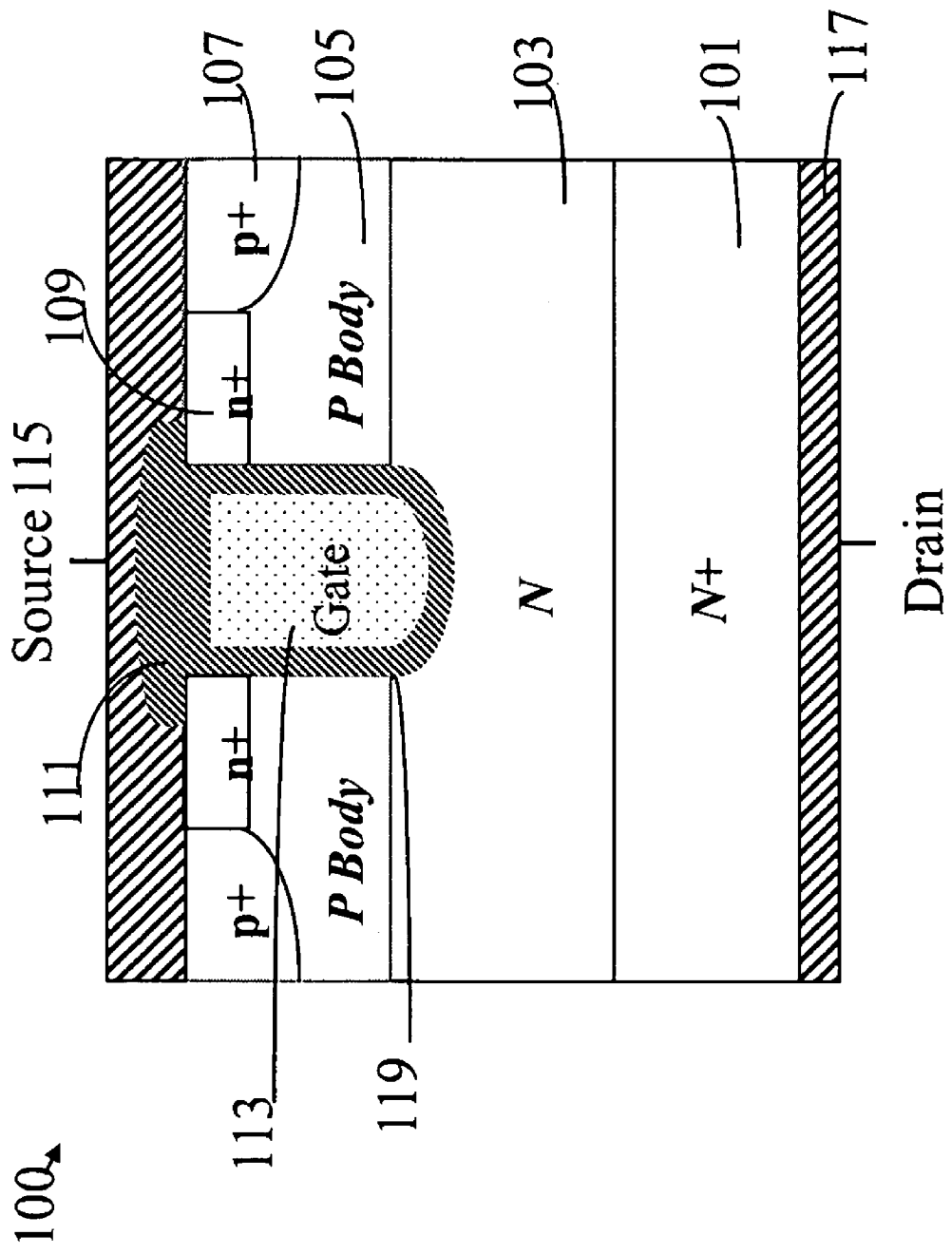
Figure 1: Trench MOSFET Prior Art

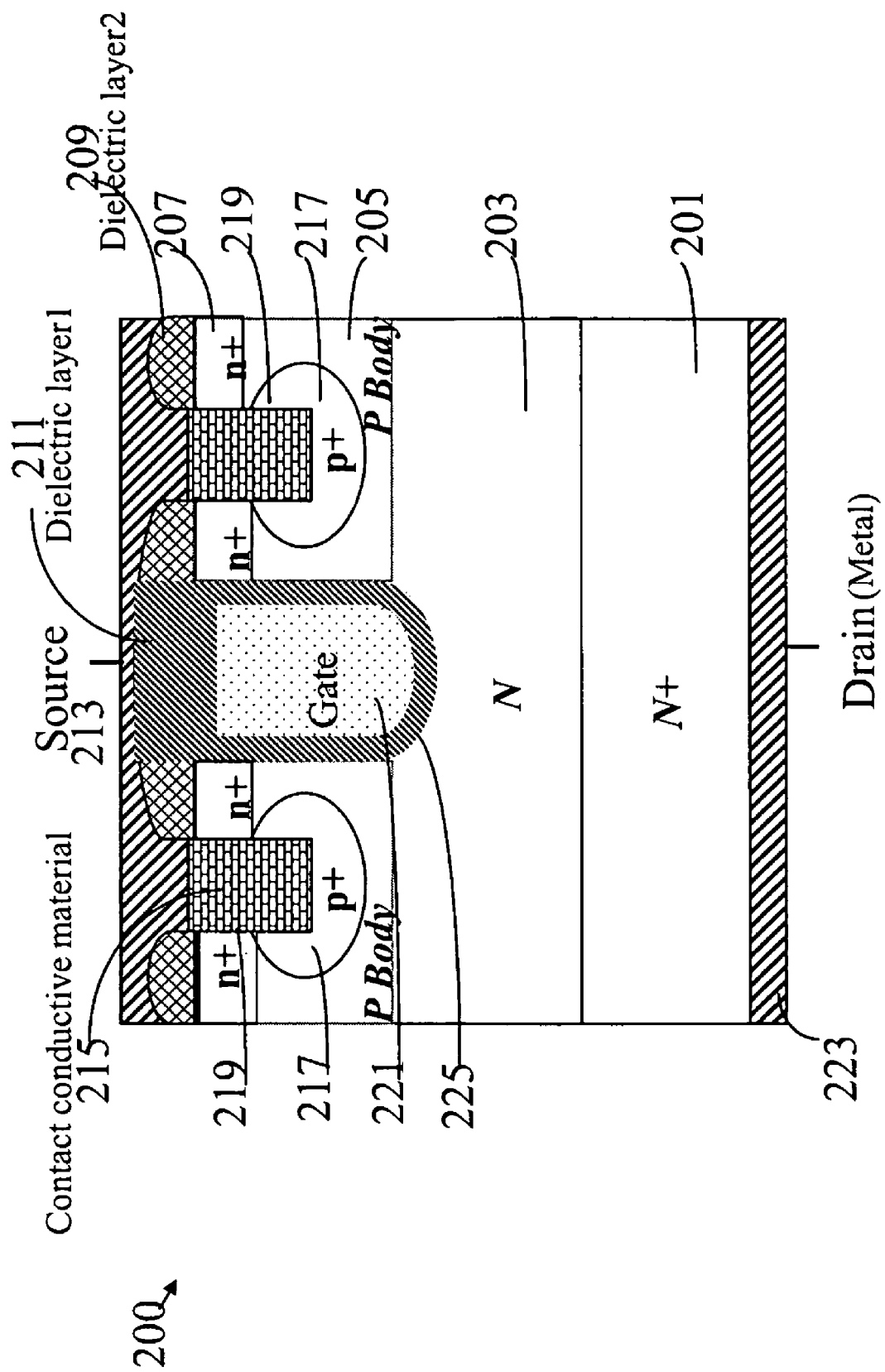
Figure 2: Super self-aligned Trench MOSFET

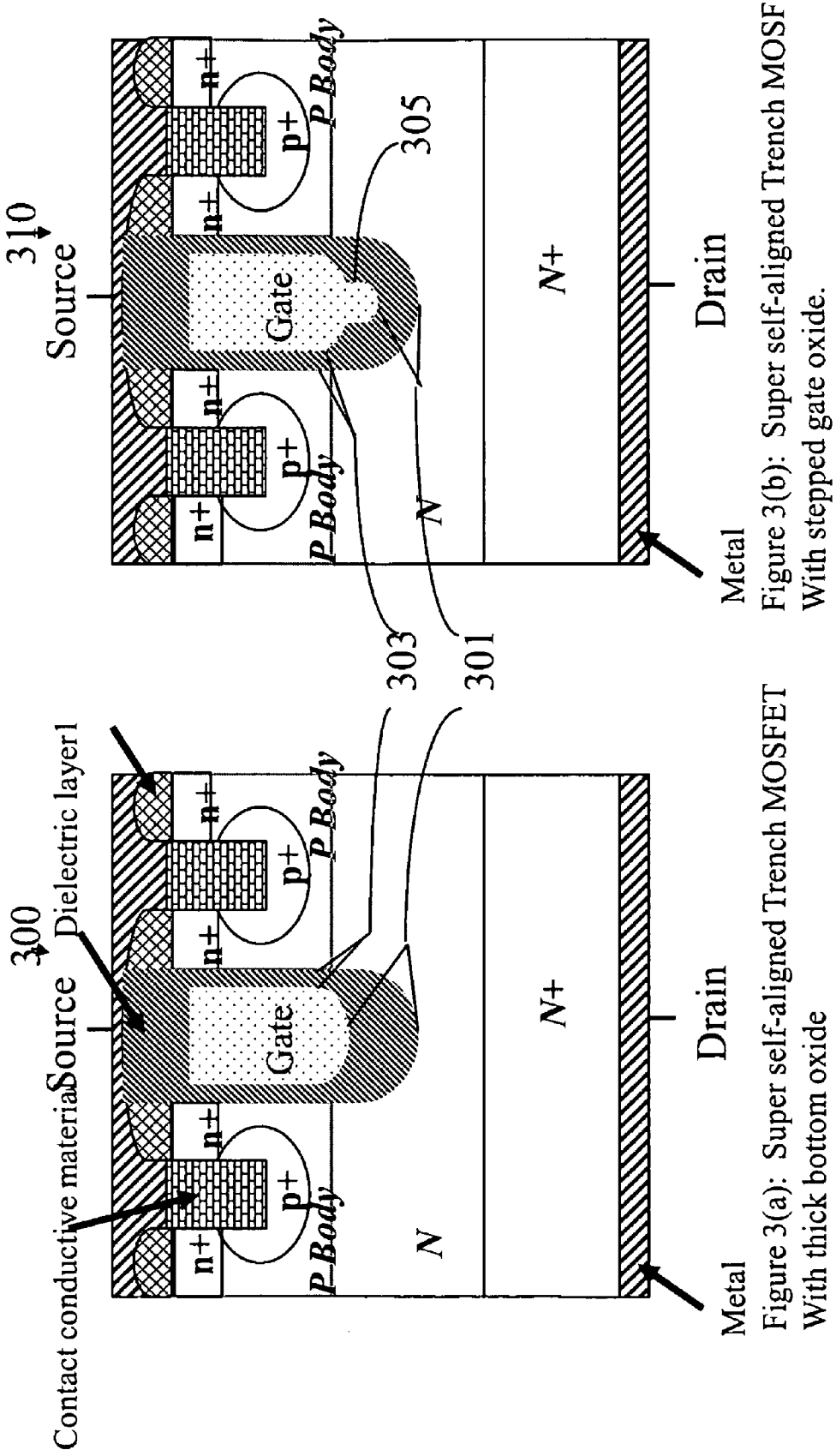
Figure 3(b): Super self-aligned Trench MOSFET With stepped gate oxide.
Figure 3(a): Super self-aligned Trench MOSFET With thick bottom oxide

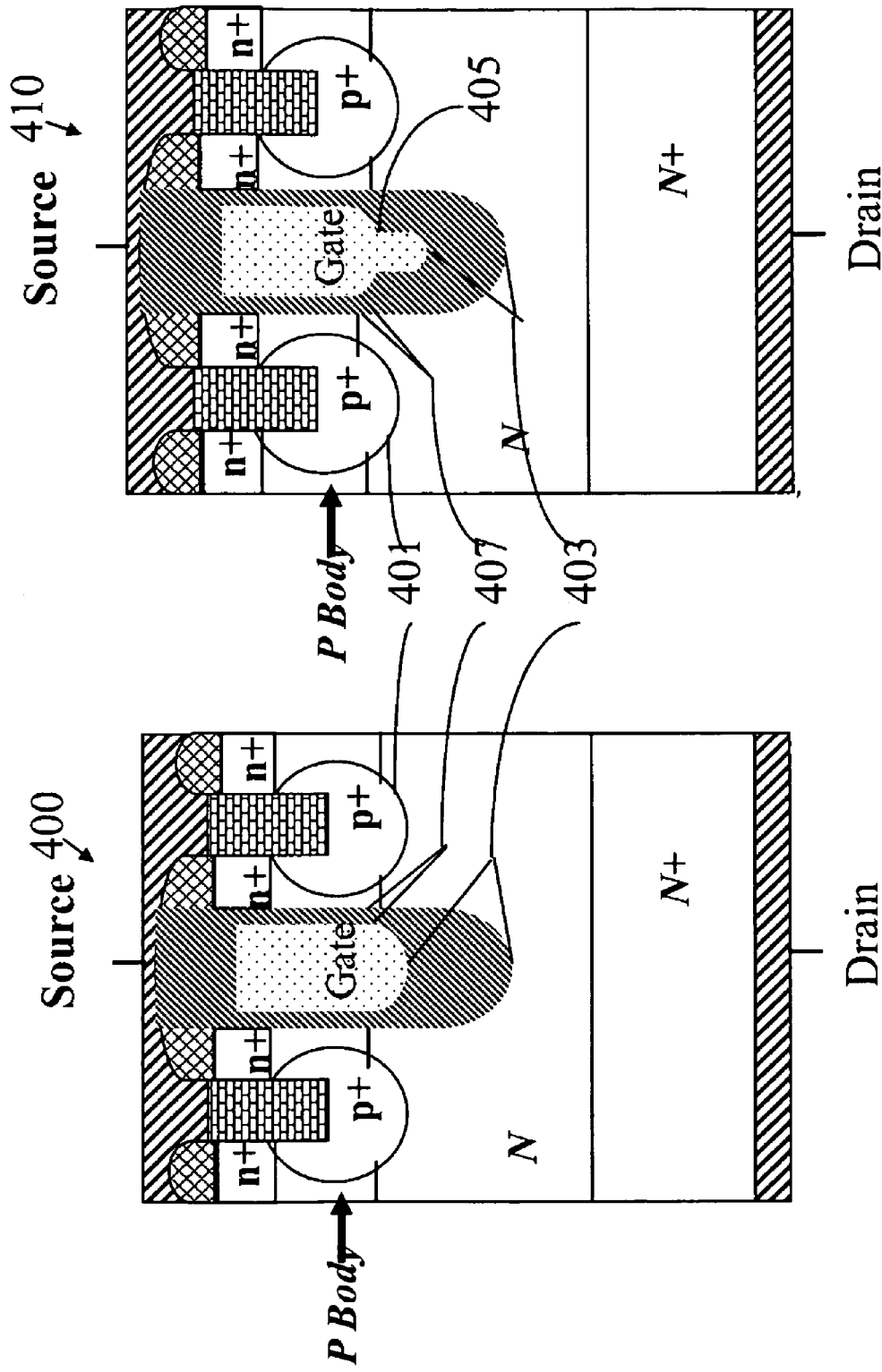
Figure 4(a): Super self-aligned Trench MOSFET   Figure 4(b): Super self-aligned Trench MOSFET
With thick bottom oxide                                                  With stepped gate oxide

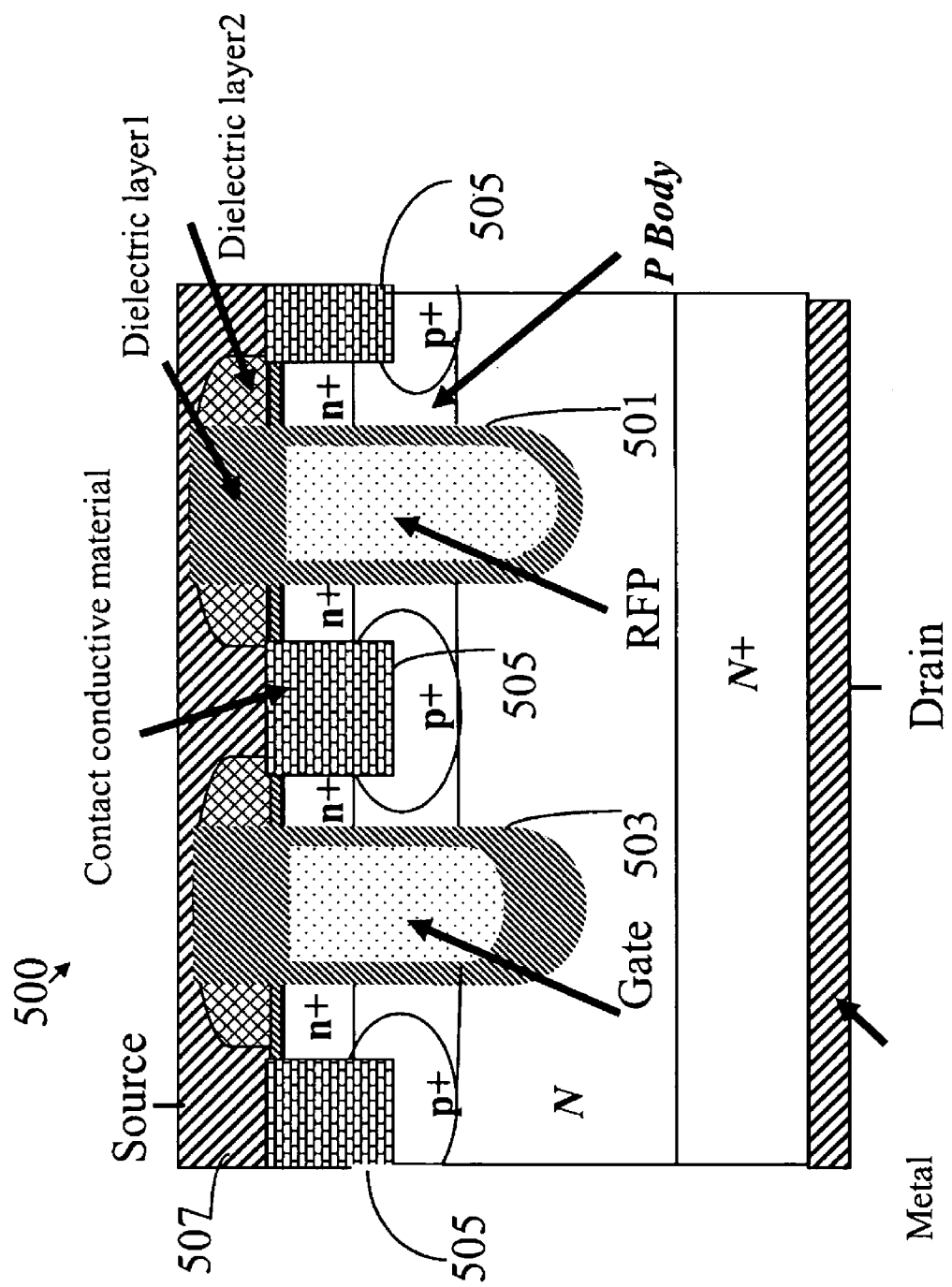
Figure 5(a): Super self-aligned Trench MOSFET with thick bottom oxide and Recessed Field Plate RFP.

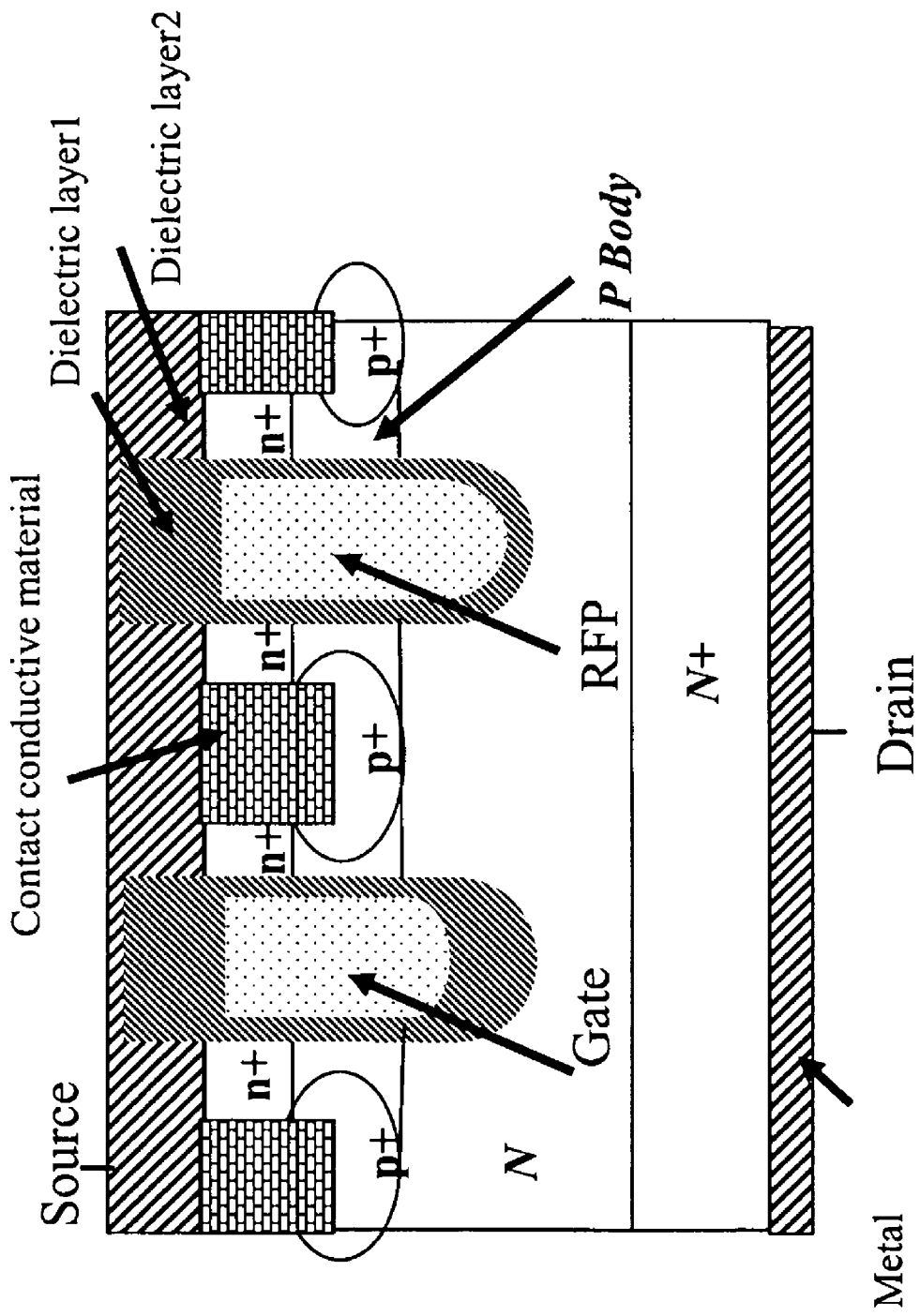
Figure 5(b): Super self-aligned Trench MOSFET with thick bottom oxide and Recessed Field Plate RFP.

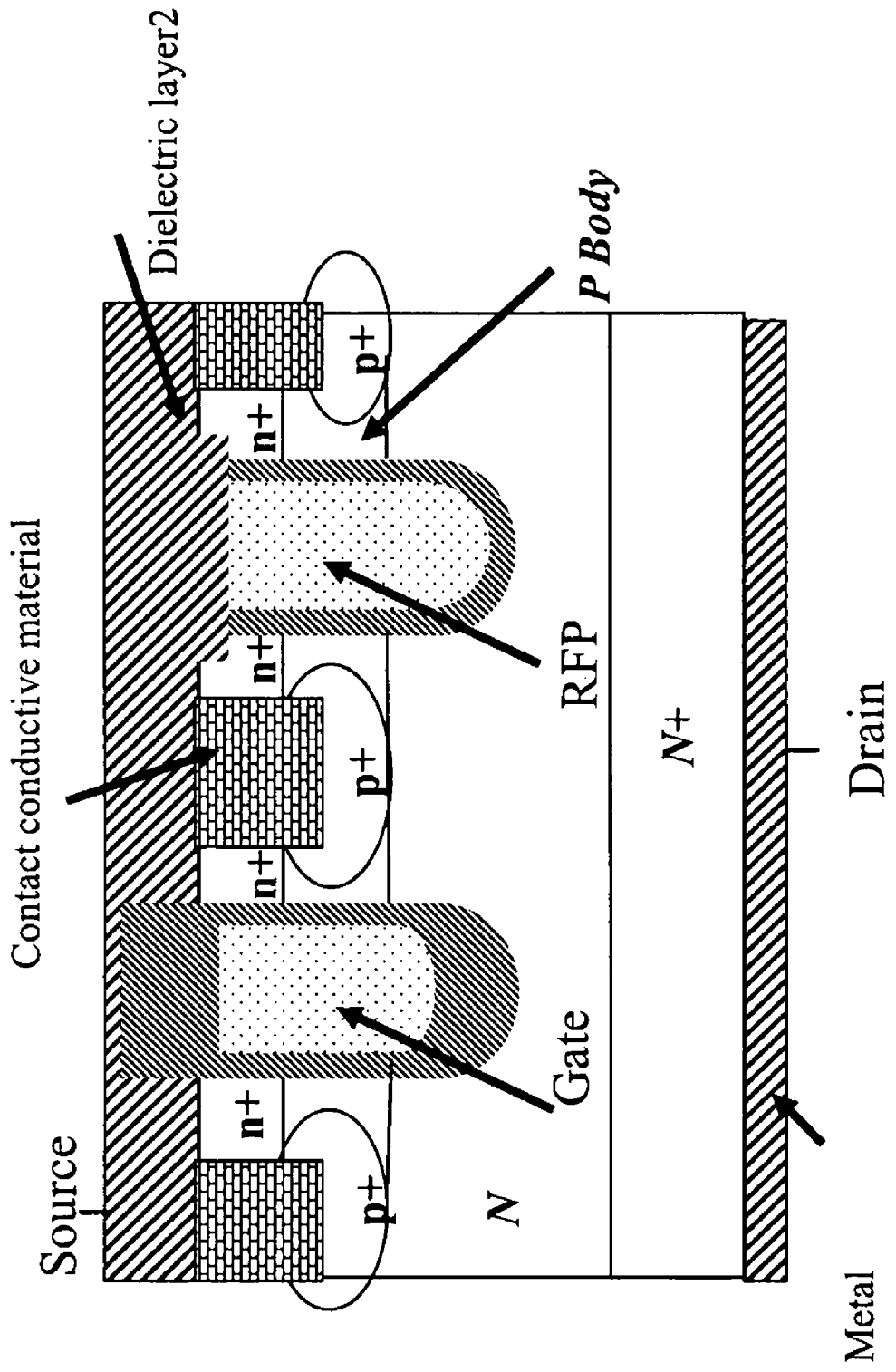
Figure 5(c): Super self-aligned Trench MOSFET with thick bottom oxide and Recessed Field Plate RFP.

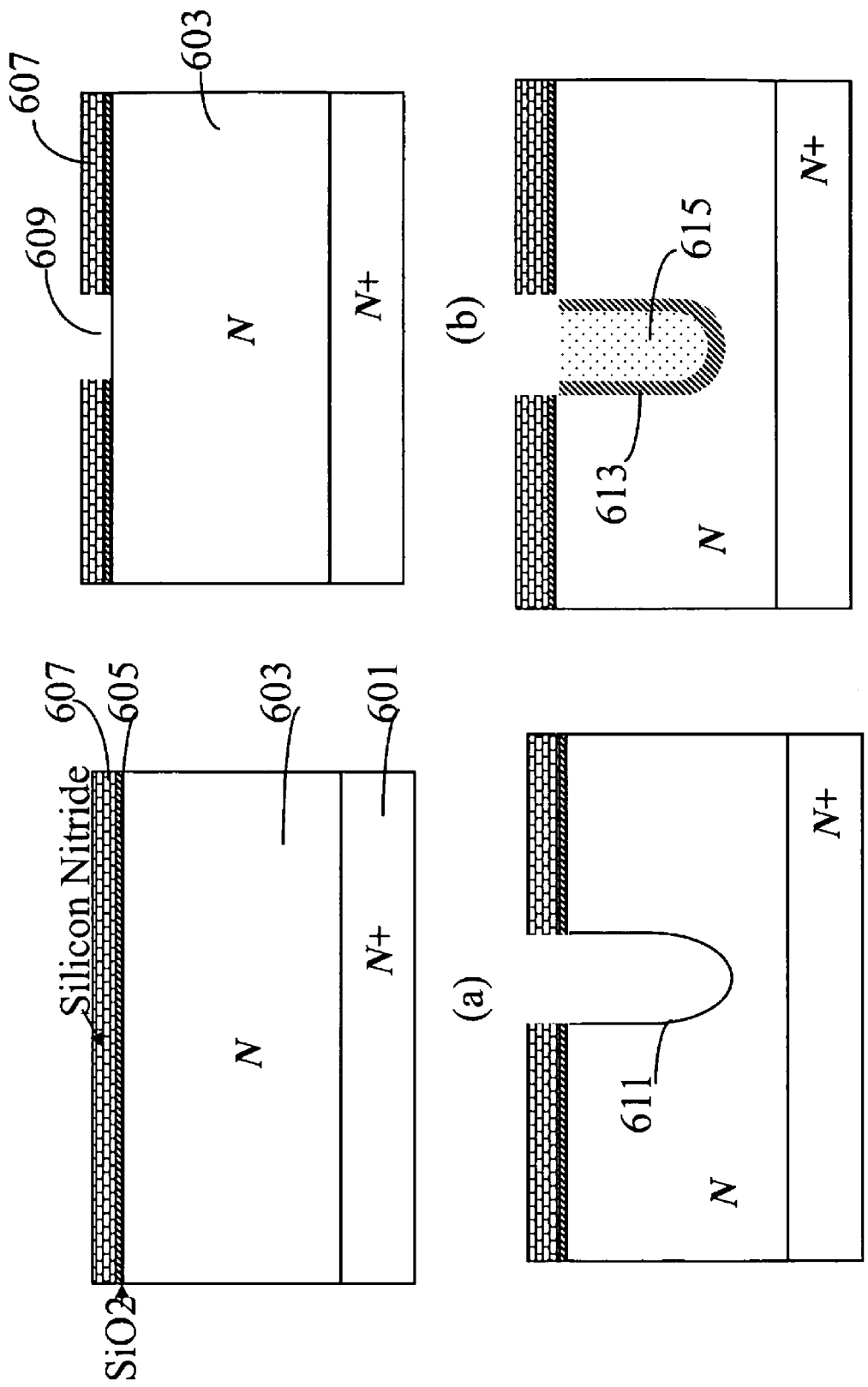
Figure 6 (a)-(d)

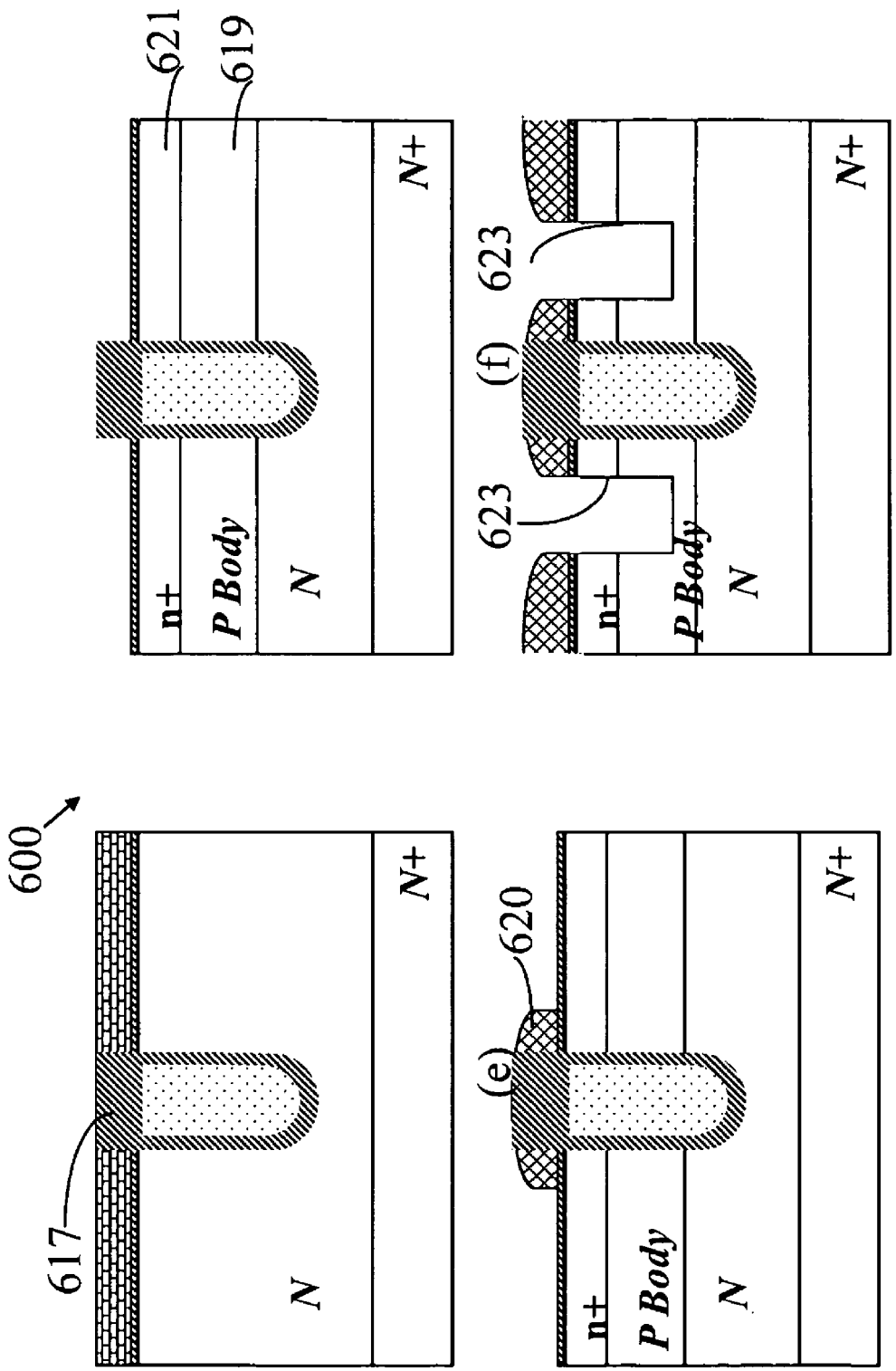
Figure 6 (e)-(h)

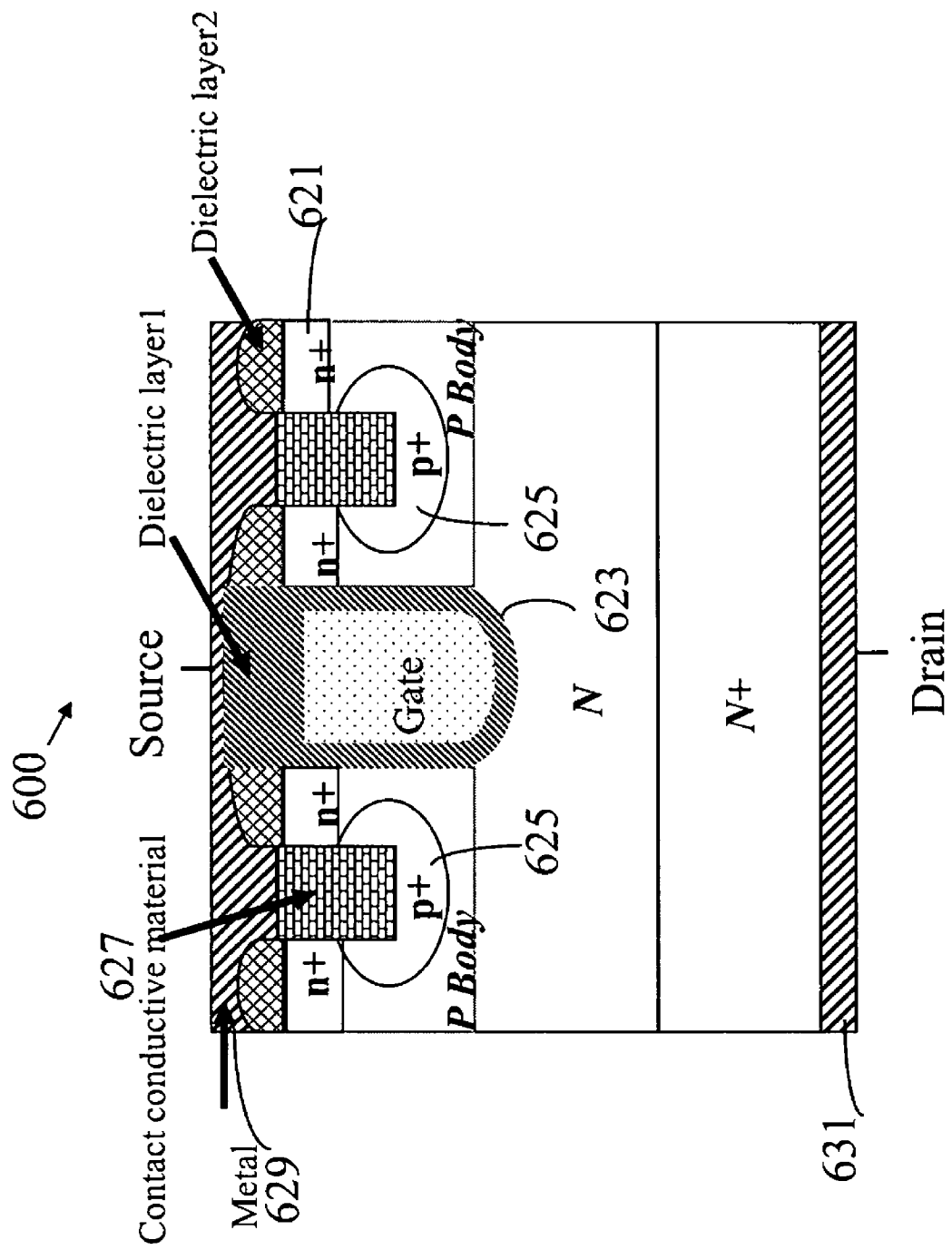
Figure 6 (i): Super self-aligned Trench MOSFET

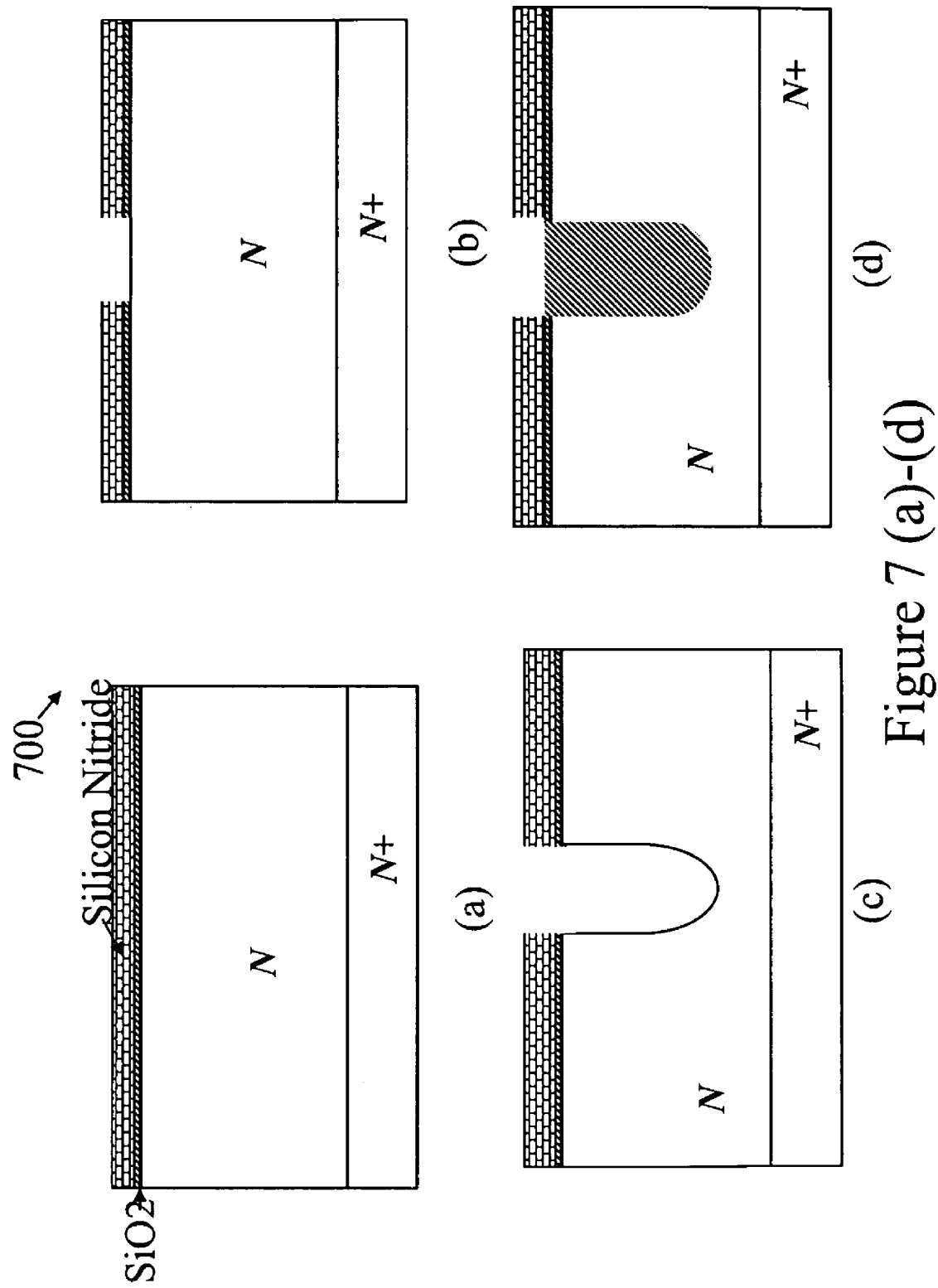
Figure 7 (a)-(d)

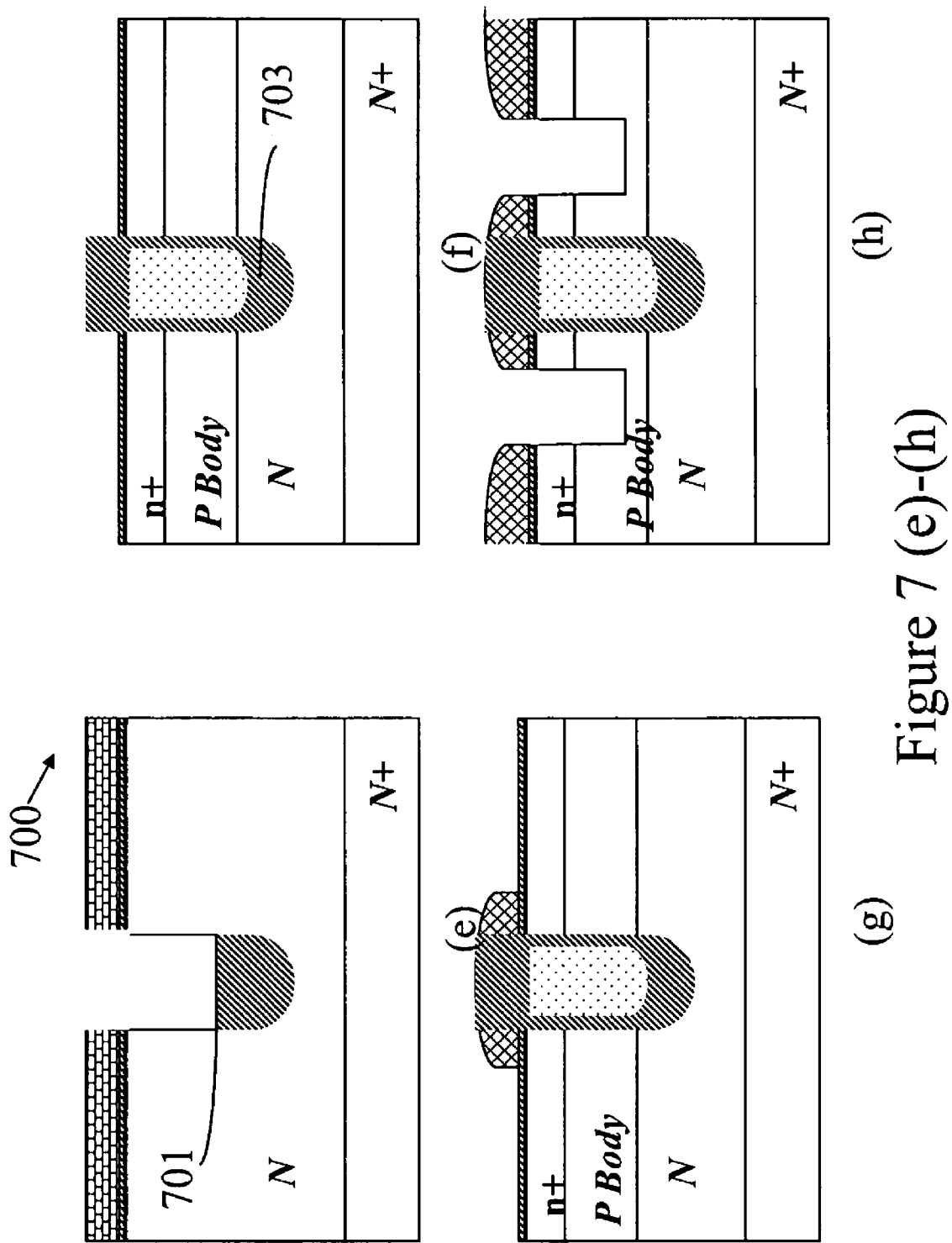
Figure 7 (e)-(h)

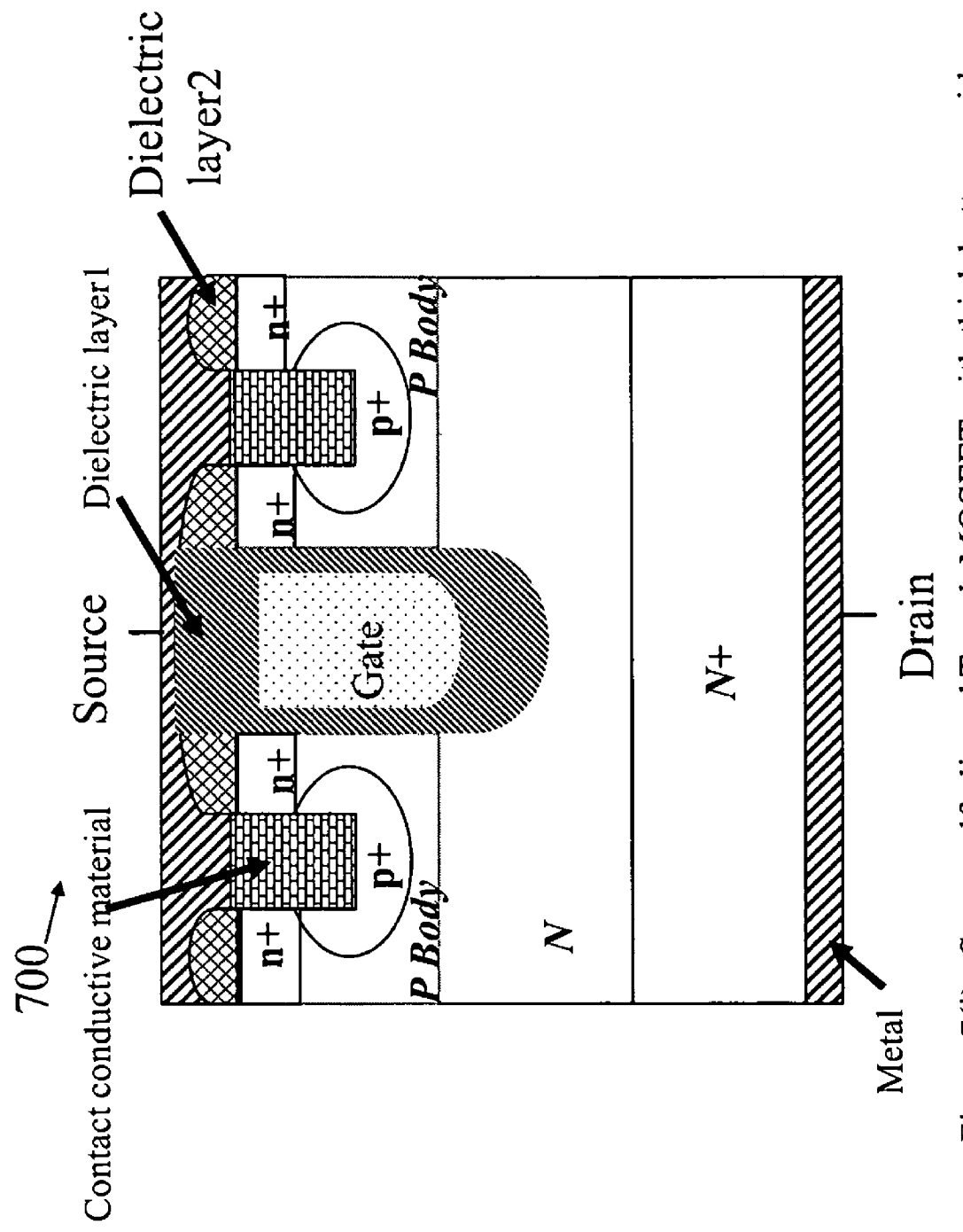
Figure 7(i): Super self-aligned Trench MOSFET with thick bottom oxide

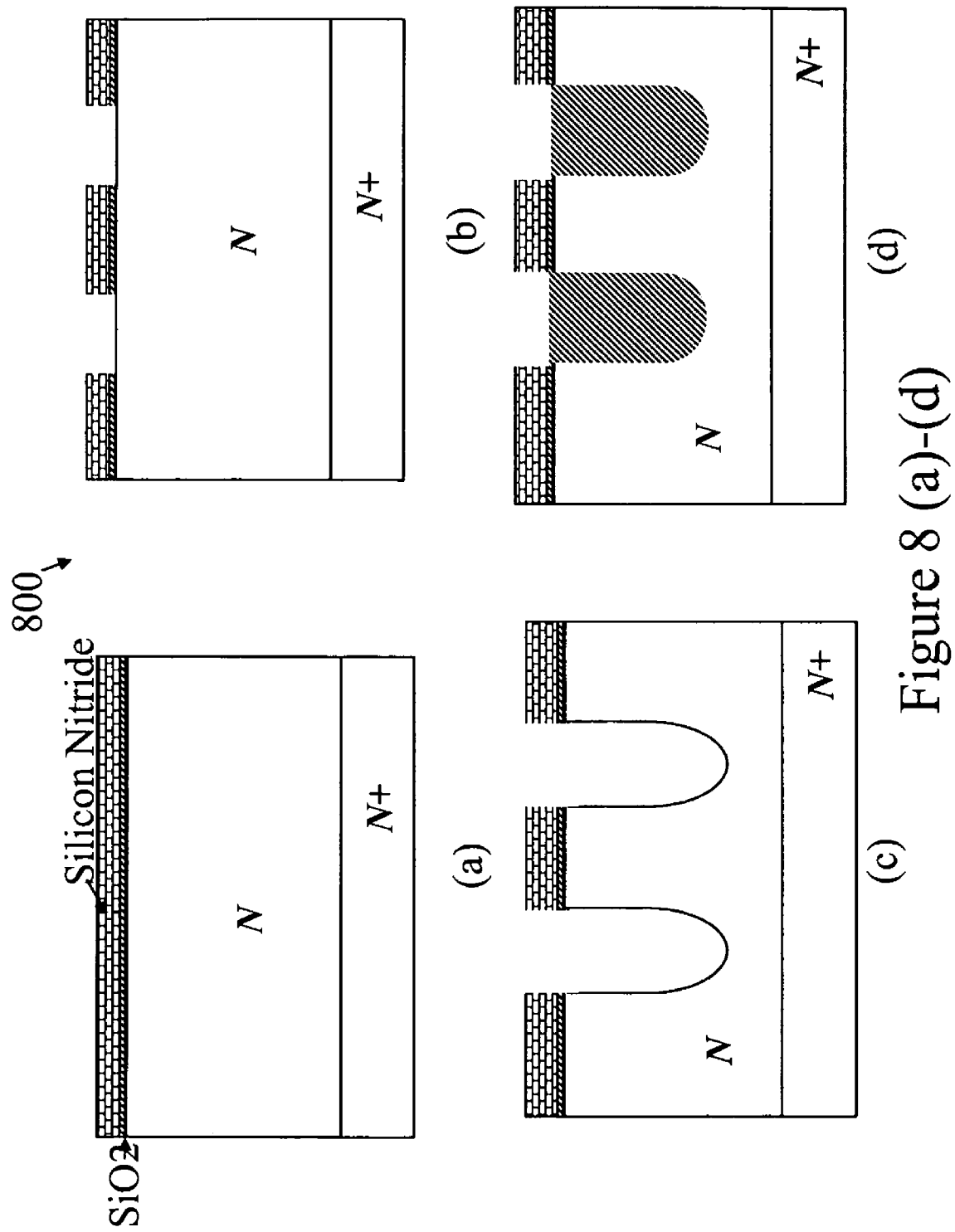
Figure 8 (a)-(d)

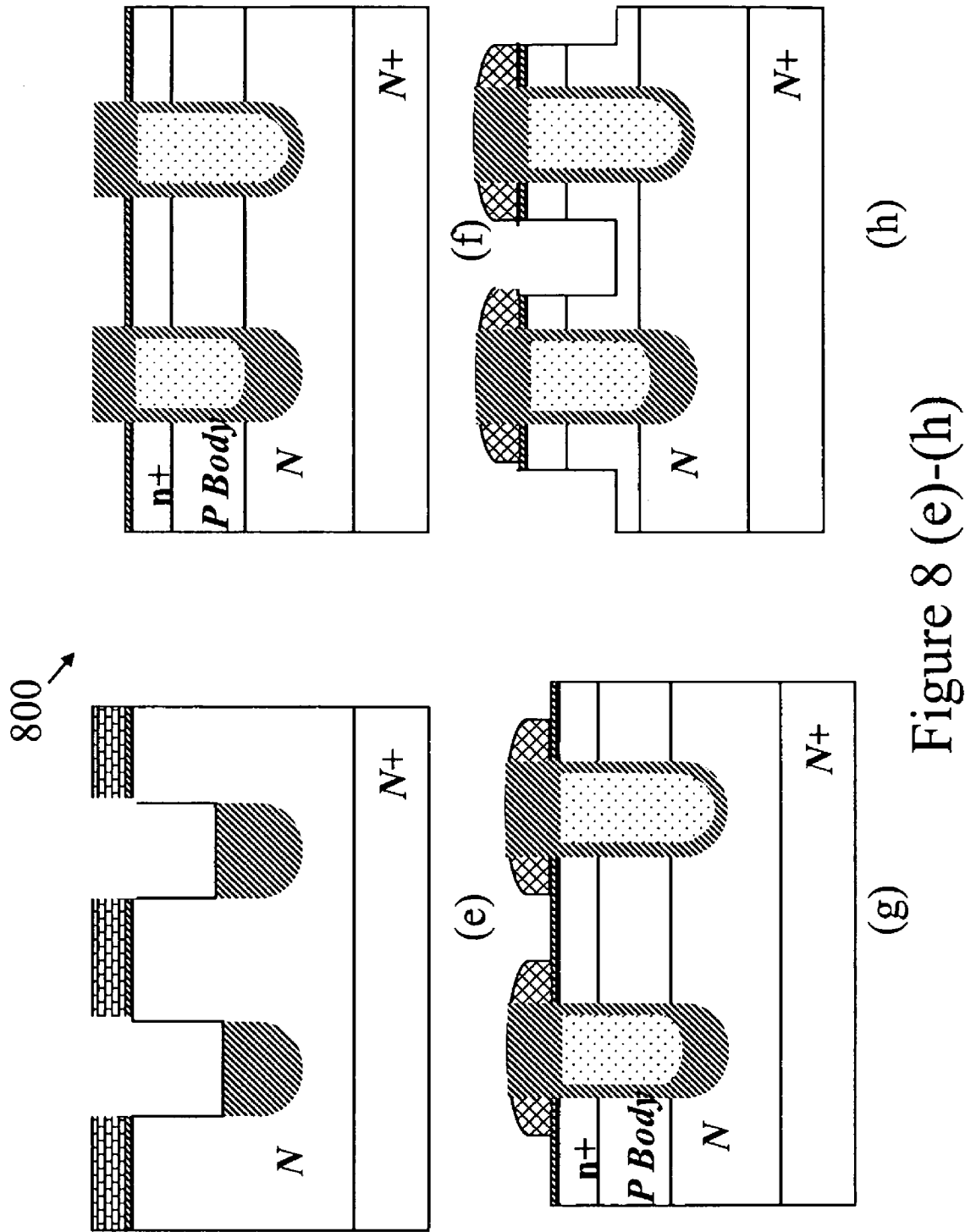
Figure 8 (e)-(h)

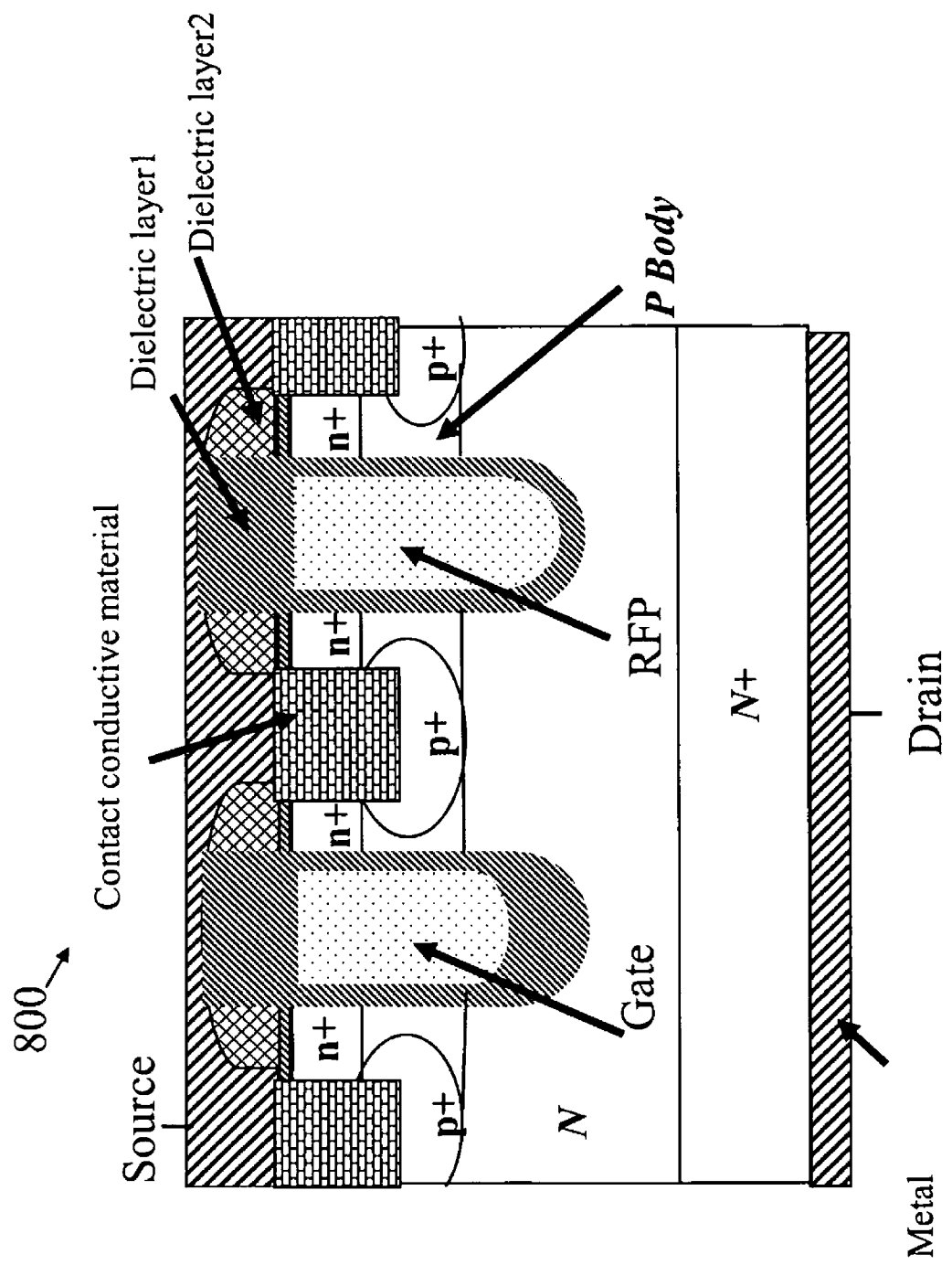
Figure 8(i): Super self-aligned Trench MOSFET with thick bottom oxide

SUPER SELF-ALIGNED TRENCH MOSFET DEVICES, METHODS, AND SYSTEMS

CROSS-REFERENCE

Priority is claimed from the U.S. Provisional Application No. 61/060,488, filed on Jun. 11, 2008, which is hereby incorporated by reference.

BACKGROUND

The present application relates to field effect transistors, and more particularly to recessed-field-plate-type trench gate power transistors and related methods.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 shows a cross-sectional view of a conventional n-type trench MOSFET.

FIG. 2 shows a cross-sectional view of an embodiment of a super self-aligned n-type trench MOSFET in accordance with this disclosure.

FIG. 3(a) shows a cross-sectional view of another embodiment of a super self-aligned n-type trench MOSFET having thick bottom oxide in accordance with this disclosure.

FIG. 3(b) shows a cross-sectional view of another embodiment of a super self-aligned n-type trench MOSFET having stepped gate oxide in accordance with this disclosure.

FIG. 4(a) shows a cross-sectional view of another embodiment of a super self-aligned n-type trench MOSFET having an expanded p+ region with thick bottom oxide in accordance with this disclosure.

FIG. 4(b) shows a cross-sectional view of another embodiment of a super self-aligned n-type trench MOSFET having an expanded p+ region with stepped gate oxide in accordance with this disclosure.

FIG. 5(a) shows a cross-sectional view of an embodiment of a super self-aligned n-type trench MOSFET with thick bottom oxide and Recessed Field Plate (RFP) in accordance with this disclosure.

FIG. 5(b) shows a cross-sectional view of another embodiment of a super self-aligned n-type trench MOSFET with thick bottom oxide and Recessed Field Plate (RFP) in accordance with this disclosure.

FIG. 5(c) shows a cross-sectional view of another embodiment of a super self-aligned n-type trench MOSFET with thick bottom oxide and Recessed Field Plate (RFP) in accordance with this disclosure.

FIGS. 6(a)-(i) schematically show a method for manufacturing a super self-aligned n-type trench MOSFET of FIG. 2.

FIGS. 7(a)-(i) schematically show a method for manufacturing a super self-aligned n-type trench MOSFET of FIG. 3(a).

FIGS. 8(a)-(i) schematically show a method for manufacturing a super self-aligned n-type trench MOSFET of FIG. 5.

DETAILED DESCRIPTION OF SAMPLE EMBODIMENTS

To minimize conduction power loss, a MOSFET needs to have a low specific on-resistance. A trench type MOSFET as shown in FIG. 1 provides a low specific on-resistance because of its high packing density or number of cells per unit area.

FIG. 1 shows a cross-sectional view of a typical n-type conventional trench gate power MOSFET 100. It includes gate electrode 113 disposed in gate trench 119 surrounded by dielectric (oxide) 111. A p-type body region 105 is formed on the surface of the n-type semiconductor drift 103 in a way that p-body region 105 is in contact with the side walls of the gate trench 119. A highly doped n-type source region 109 and a highly doped p-type contact region 107 are formed on the surface of p-body 105 in a way that source region 109 and contact region 107 are in contact with each other while source region 109 is also in contact with the side walls of gate trench 119. The source electrode 115 is formed over the n-type source region 109 and the p-type contact region 107 while the drain electrode 117 is formed at the bottom surface of the n-type doped semiconductor substrate of drain region 101.

However, as the cell density increases, the associated capacitances, such as the gate-to-source capacitance (Cgs), the gate-to-drain capacitance (Cgd), and the drain-to-source capacitance (Cds) also increase. Since the magnitudes of these capacitances are directly proportional to the gate charge (Qg), the gate-drain charge (Qgd), and output charge (Qoss), it is desirable to have improved structure and manufacturing process that has high cell density but has low gate charge, gate-drain charge, and output charge.

U.S. Pat. No. 6,921,939 to Zeng, which is hereby incorporated by reference, describes a self-aligned MOSFET process in which a silicon etch is performed, after the gate trench has been filled. This exposes a vertical pillar, on which sidewall spacers can be formed to define the offset for body contacts.

The present application discloses new approaches to making and manufacturing a super self-aligned recessed-field-plate MOSFET. A body contact trench is self-aligned to the gate trench and to the field-plate trench. This is preferably performed by a "pattern-reversal" sequence of steps, in which pillars are automatically formed over the gate and field-plate trenches. Sidewall spacers then define the body contact trench locations (within the active area), with a minimal spacing between the three trenches.

The disclosed innovations, in various embodiments, provide one or more of at least the following advantages. However, not all of these advantages result from every one of the innovations disclosed, and this list of advantages does not limit the various claimed inventions. The present application discloses a trench power MOSFET that has:

Low specific on-resistance;
Super self-aligned structure that is easy to manufacture;
Lower switching power loss;
Lower gate-source and gate-drain capacitance;
Lower gate charge and gate-drain charge.

The numerous innovative teachings of the present application will be described with particular reference to presently preferred embodiments (by way of example, and not of limitation). The present application describes several embodiments, and none of the statements below should be taken as limiting the claims generally.

For simplicity and clarity of illustration, the drawing figures illustrate the general manner of construction, and description and details of well-known features and techniques may be omitted to avoid unnecessarily obscuring the invention. Additionally, elements in the drawing figures are not necessarily drawn to scale, some areas or elements may be expanded to help improve understanding of embodiments of the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

To provide improved conduction and minimized switching power losses, a new super self-aligned trench MOSFET structure that has shortened source-body channel, reduced specific on-resistance, lower gate charges and gate-drain charges is described herein below. It is contemplated and intended that the various inventions described can apply to both n-type and p-type MOSFETs, as well as to other types of devices as described below. For simplicity, the examples given are based on n-type MOSFET structures, but one of ordinary skill in the art will understand that many variations can be applied to the inventions described.

FIG. 2 is a simplified schematic cross-sectional view of a super self-aligned n-channel MOSFET 200 of vertical configuration according to this disclosure. Super self-aligned MOSFET 200 includes an n-type epitaxial layer 203 formed on the surface of an n-type (or n+ type) silicon substrate 201. Gate trench 225 is formed by etching into epitaxial layer 203, spanning p-type body layer 205 and n-type source region 207. Gate trench 225 is insulated with a thin layer of oxide and filled with polysilicon as gate electrode 221.

Gate electrode 221 is covered with dielectric layer 211, of dielectric material such as silicon oxide or silicon nitride. Insulator spacer 209, another dielectric layer of e.g. silicon oxide or silicon nitride, overlies 211, covers source region 207, and leaves sufficient space open for body-contact trench 219 that spans into p-body 205. Body-contact trench 219 is therefore self-aligned with the gate trench 225. The n-type source region 207 is formed on the upper surface of p-body 205.

A p+ type of dopant concentration layer 217 is formed at the bottom of body-contact trenches 219, interfacing with p-body 205. Region 217 can be generated by implantation or driven in starting near the intersection between n-type source region 207 and p-type body layer 205, and can span to below the junction of layer 205 and layer 203. Body-contact trench 219 is filled with conductive material 215 such as metal barrier or metal or tungsten.

Gate electrode 221 in gate trench 225 is covered by dielectric layer 211. This layer extends above the silicon surface, and is separated from the body-contact trench 219 by dielectric layer 209. Dielectric layer 211, dielectric layer 209 and body-contact trench 219 are self-aligned to the gate trench 225. Dielectric layer 211 and dielectric layer 209 can be made of the same or different dielectric materials, such as silicon oxide, silicon nitride, or any known dielectrics.

Metal source electrode 213 is layered on the surface to cover the n-type source region 207, the body-contact trenches 219, its conductor 215 inside, and the dielectric layer 211 and 209. A drain electrode is formed at the bottom surface of n-type silicon substrate layer 201. Therefore through body-contact trench 219 and its conductive filling material 215, p+ layer 217 provides a source-body short.

FIG. 3(a) shows an embodiment wherein the super self-aligned trench MOSFET 300 has a thick bottom gate dielectric material 301 that is thicker than the gate dielectric material 303 between gate electrode and the trench wall, such configuration reduces the gate-drain charge Qgd.

FIG. 3(b) shows another embodiment wherein the super self-aligned trench MOSFET 310 has a thick bottom gate dielectric material 301 that is not only thicker than the gate dielectric material 303 between gate electrode and the trench wall but also is step-shaped, forming a step-shaped gate electrode 305 which further reduces the gate-drain charge Qgd. The stepped gate oxide design can also be combined with other embodiment features.

It is contemplated and intended that variations and modifications can be made as to the depth of the p-body 205, the epitaxial layer 203, the source region 207, the drain layer 201, the relative positions between the gate trench 225 and body-contact trench 219, and the relative depth of the individual trenches and other features that is obvious to an ordinary person in the art. Although FIG. 1 only shows one gate trench and one body-contact trench, plurality of individual respective trenches can be made in reality and in theory.

FIGS. 4(a) and 4(b) show embodiments wherein the super self-aligned trench MOSFET 400 and 410 have a p+ dopant concentration region 401 near the bottom of body-contact trench that extends below the p-body and N-epitaxial junction. Likewise, as in FIGS. 3(a) and 3(b), the gate dielectric material 403 at the gate trench bottom can be thicker than gate dielectric material 407 that is located between the gate electrode and the gate trench wall. The gate oxide 407 can also be step-shaped to form a step-shaped gate electrode 405 to further reduce the gate-drain charge Qgd.

Metal source electrode 213 is layered on the surface to cover the n-type source region 207, the body-contact trenches 219, its conductor 215 inside, and the dielectric layer 211 and 209. A drain electrode 223 is formed at the bottom surface of n-type silicon substrate layer 201. Therefore through body-contact trench 219 and its conductive filling material 215, p+ layer 217 provides a source-body short.

Various RFP configurations for trench MOSFET are described in US 2008/0073707A1, which is incorporated herein by reference. Those configurations can be combined with the addition of body-contact trench and the features described in FIG. 2.

FIGS. 5(b) and 5(c) further show that the spacer dielectric layer 2 which is used as an insulator spacer separating the body-contact trench from the gate trench and RFP trench can be removed prior to metal deposition to the body-contact trench, so that more n+ source region surface area is exposed to the metal of source electrode. Further, the dielectric layer 1 covering the RFP electrode may also be removed from the surface of RFP trench for better contact coverage as shown in FIG. 5(c).

Gate trenches and RFP trenches can optionally be filled with different types of conductive material. For example, the gate trench can be filled with a n-type polysilicon while the adjacent RFP trench is filled with p-type polysilicon. The N-epitaxial drift region 201 in FIG. 2, and the equivalent regions in other figures, can optionally be non-uniformly doped; for example, the doping can be graded to have higher doping concentration as the substrate base region and decrease towards the surface. A stepped oxide can be used for the RFP trench only, or for both the gate trench and the RFP trench.

The super self-aligned MOSFET structures described above can be implemented in a quasi-vertical or lateral configuration. The structure can also be laid out in various striped or cellular patterns.

An exemplary process for fabricating super self-aligned trench MOSFET 200 of FIG. 2 is shown in FIGS. 6(a)-6(i). In FIG. 6(a), heavily doped n+ substrate 601, as a starting material, may have been doped with phosphorus or arsenic. The n-type epitaxial layer 603 is then grown on the top surface of the n+ substrate 601. After growing a thin silicon oxide layer 605 over the n-type epitaxial layer 603, a silicon nitride layer 607 is deposited on top of the oxide layer 605. The preferred thickness for oxide layer 605, for example, can be 200-300 Å and for the silicon nitride layer 607 can be 1000-4000 Å.

In FIG. 6(b), photoresist mask (not shown) is used to pattern the silicon nitride layer 607, with opening 609. The exposed silicon nitride and oxide layers, and the underneath layers of n-type epitaxial layer 603 at the opening 609, are then etched away, forming a gate trench 611 shown in FIG. 6(c). It will be understood that gate trench 611 is for illustration only, since in practice numerous trenches will typically be formed. Then a thin thermal oxide 613 of 300-1000 Å is grown on the walls of gate trench 611 (FIG. 6(d)). Then polysilicon 615 is deposited and doped (e.g. n-type) to form gate electrode as shown in FIG. 6(d).

The polysilicon 615 is then etched back, and gate trench 611 is then filled with silicon dioxide 617 (which can be formed in various ways, e.g. LTO or TEOS or High Density Plasma). The oxide is then etched back, as shown in FIG. 6(e), using e.g. a dry plasma etch or CMP technique, to the same level as or slightly below the level of the silicon nitride 607. Alternatively, the polysilicon 615 can be etched to the same level as, or slightly lower than, the silicon nitride, and polysilicon 615 is then oxidized such that the oxide layer extends downward toward the silicon surface.

The silicon nitride layer 607 and silicon oxide layer 605 are etched by plasma or wet etching (or a combination of wet and dry etching). Then as shown in FIG. 6(f), without further masking, p-body region 619 and the n+ source region 621 are formed by several implanting steps using p-type and n-type dopants such as arsenic or phosphorus or a combination thereof. They are then driven-in and activated using furnace or rapid thermal anneal (RTA) methods.

Another layer of dielectric material is then deposited onto the protruding dielectric 617 of gate electrode 615, and spacer 620 near the gate trench is formed after anisotropically etching away extra deposition, as shown in FIG. 6(g). The spacer can be made of silicon nitride, silicon oxide such as LTO or TEOS, or other compatible dielectric material. Standard etching process is performed at the non-covered area on the source layer through p-body layer and body-contact trenches 623 are then etched sufficiently into the p-body region, which are self-aligned to the gate trench as shown in FIG. 6(h).

An exemplary process for fabricating a super self-aligned trench MOSFET 600, which is similar to that of FIG. 2, is shown in FIGS. 6(a)-6(i). In FIG. 6(a), heavily doped n+ substrate 601, as a starting material, may have been doped with phosphorus or arsenic. The n-type epitaxial layer 603 is then grown on the top surface of the n+ substrate 601. After growing a thin silicon oxide layer 605 over the n-type epitaxial layer 603, a silicon nitride layer 607 is deposited on top of the oxide layer 605. The preferred thickness for oxide layer 605, for example, can be 200-300Å, and for the silicon nitride layer 607 can be 1000-4000Å.

FIGS. 7(a)-7(i) disclose an example of a process for fabricating a super self-aligned trench MOSFET 700 with a gate trench having a thick bottom oxide layer. The detailed description of the process of making a gate trench having a thick bottom oxide layer can be found in US 2008/0073707 A1 filed by Darwish, which is incorporated by reference. Briefly, thick bottom oxide is formed using deposited oxide such as LTO or HDP and etching it back to leave a thick oxide layer at the trench bottom as shown in FIGS. 7(d) and (e). Alternatively, the thick oxide layer shown in FIG. 7(e) can be formed using LOCOS technique. Then the steps of FIG. 6(g)-(i) are applied to fabricate the body contact trenches and p+ contact regions as shown in FIG. 7(g)-(i).

FIGS. 8(a)-(i) disclose an example of a process for fabricating a super self-aligned trench MOSFET 800 having a gate trench and a RFP trench. The detailed description of the process of making a MOSFET having a gate trench and a RFP trench can be found in US 2008/0073707 A1 filed by Darwish, which is incorporated by reference. Briefly as shown in FIG. 8(c), a gate and a RFP trench are etched the same step. Alternatively, a thick bottom oxide is formed at the gate trench using the methods previously described. Thick oxide is etched from RFP trench using photoresist as a mask to protect the gate trench oxide. Then the steps of FIG. 6(g)-(i) are applied to fabricate the contact trenches and p+ contact regions as shown in FIG. 8(g)-(i).

For the variations described in FIGS. 5(a) and 5(b), further steps of removing dielectric layer 1 and 2 by etching or CMP can be performed.

According to some (but not all) disclosed embodiments, there is provided: A method of fabricating a trench transistor, comprising, in any order, the actions of: fabricating a gate trench from a first surface down toward a first-conductivity-type semiconductor drift layer, said gate trench penetrating through a second-conductivity-type body layer which overlies said drift layer; patterning a sacrificial layer to form openings above said respective gate trenches, forming respective pillars above said gate trenches, and removing said sacrificial layer; forming sidewall spacers on said pillar fabricating a body-contact trench from said first surface into said body layer, in locations where said body layer is not covered by said sidewall spacers nor by said pillars; and introducing an additional dopant concentration of said second-conductivity type, in addition to the doping of said body layer, into the region surrounding the bottom of said body-contact trench; whereby said steps (a) and (b) form said gate trench and said body-contact trench in a mutually self-aligned spatial relationship.

According to some (but not all) disclosed embodiments, there is provided: A method of fabricating a trench gate semiconductor field-effect transistor, comprising, in any order, the actions of: fabricating a gate trench, through a first-conductivity-type source region and a second-conductivity-type body layer, toward a first-conductivity-type semiconductor drift layer; and forming a gate conductor, in said gate trench, which is capacitively coupled to at least part of said body layer; and also patterning a sacrificial layer to form openings above said respective gate trenches, forming respective pillars above said gate trenches, and removing said sacrificial layer; forming respective sidewall spacers on ones of said pillars; etching a body-contact trench into said body layer; depositing conductive material into said body-contact trench to form a contact to said body layer; wherein said gate trench and said body-contact trench are formed in a mutually self-aligned spatial relationship.

FIGS. 7(a)-7(i) disclose an example of a process for fabricating a super self-aligned trench MOSFET 700 with a gate trench having a thick bottom oxide layer. The detailed description of the process of making a gate trench having a thick bottom oxide layer can be found in US 2008/0073707 A1 filed by Darwish, which is incorporated by reference. Briefly, thick bottom oxide is formed using deposited oxide such as LTO or HDP and etching it back to leave a thick oxide layer 701 at the trench bottom as shown in FIGS. 7(d) and (e). Alternatively, the thick oxide layer shown 703 in FIG. 7(e) can be formed using a LOCOS technique. Then the steps of FIG. 6(g)-(i) are applied to fabricate the body contact trenches and p+ contact regions as shown in FIG. 7(g)-(i).

According to some (but not all) disclosed embodiments, there is provided: A super self-aligned trench-gate transistor, comprising: a source region and a body region that are in contact with each other, wherein said source region comprises a layer of first conductivity-type material and said body region comprises a layer of second conductivity-type material, and the body region is also in contact with a drift layer that comprises a layer of material having the same conductivity type as the source region; a gate trench spanning the first-conductivity-type source layer and the second-conductivity-type body layer into the drift layer; a recessed-field-plate trench spanning the first-conductivity-type source layer and the second-conductivity-type body layer into the drift layer; a body-contact trench spanning from the source region layer into the body layer, having walls that are in contact with both the source region layer and the body region layer; and an additional dopant concentration of said second-conductivity type, in addition to the doping of said body layer, in the region surrounding the bottom of said body-contact trench; wherein both said gate trench and said recessed-field-plate trench are self-aligned to said body-contact trench, and said gate trench contains a gate electrode and said recessed-field-plate trench contains a recessed-field-plate electrode, the body-contact trench is filled with conductive material that is in contact with the source region layer, the body region layer and a source electrode.

According to some (but not all) disclosed embodiments, there is provided: a manufacturing process and design structure for a super self-aligned trench power MOSFET. A plurality of super self-aligned trenches of different depths are formed into the body layer and epitaxial layers, preferably by using a multilayer stack of dielectric material etched to form spacers. Respective trenches contain gate conductors, body-contact conductors, and preferably a third trench containing a recessed field plate. This results in a MOSFET structure having high cell density and low gate charges and gate-drain charges.

Modifications and Variations

As will be recognized by those skilled in the art, the innovative concepts described in the present application can be modified and varied over a tremendous range of applications, and accordingly the scope of the patented subject matter is not limited by any of the specific exemplary teachings given. It is intended to embrace all such alternatives, modifications and variations that fall within the spirit and broad scope of the appended claims.

Many additional and alternative embodiments in accordance with the principles of this disclosure will be apparent to persons of skill in the art from the above descriptions. For example, the above described principles can equally be applied to manufacture p-channel MOSFETs with reversal of dopant types and voltages.

The innovative devices, in various embodiments, can be fabricated in various layouts, including "stripe" and "cellular" layouts. The source, body, and drain regions can be configured vertically or quasi-vertically as well as laterally. The epitaxial drift region can be either uniformly or non-uniformly doped. While the embodiments described above include an epitaxial layer grown on a substrate, the epitaxial layer can be omitted in some applications. Various features of different embodiments can be combined and recombined for various applications.

The design could be applied to IGBTs or other devices which include bipolar conduction. The bottom of the gate trench can be modified with dopant; the design can also vary at the source structure and at the drain structure; and alternative body structures may be used. For example, the contact trench can optionally be produced first, and then the gate trench is etched, and then the source and drain structures are constructed.

Other device structures and processes, which help to envision the scope of modifications of the disclosed inventions, can be found in the following commonly assigned applications, all of which are hereby incorporated by reference:

The following applications may contain additional information and alternative modifications: Ser. No. 61/125,892 filed Apr. 29, 2008; Ser. No. 61/058,069 filed Jun. 2, 2008 and entitled "Edge Termination for Devices Containing Permanent Charge"; Ser. No. 61/065,759 filed Feb. 14, 2008 and entitled "Highly Reliable Power MOSFET with Recessed Field Plate and Local Doping Enhanced Zone"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/084,639 filed Jul. 30, 2008 and entitled "Lateral Devices Containing Permanent Charge"; Ser. No. 61/084,642 filed Jul. 30, 2008 and entitled "Silicon on Insulator Devices Containing Permanent Charge"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

The invention claimed is:

1. A method of fabricating a trench transistor, comprising, in any order, the actions of:
    (a) fabricating a gate trench from a first surface down toward a first-conductivity-type semiconductor drift layer, said gate trench penetrating through a second-conductivity-type body layer which overlies said drift layer;
    (b) patterning a sacrificial layer to form openings above said respective gate trenches, forming respective pillars above said gate trenches, and removing said sacrificial layer;
    (c) forming sidewall spacers on said pillar;
    (d) fabricating a body-contact trench from said first surface into said body layer, in locations where said body layer is not covered by said sidewall spacers nor by said pillars; and (e) introducing an additional dopant concentration of said second-conductivity type, in addition to the doping of said body layer, into the region surrounding the bottom of said body-contact trench;

whereby said steps (a) and (b) form said gate trench and said body-contact trench in a mutually self-aligned spatial relationship.

2. The method of claim 1, wherein the step of fabricating said body contact trench is performed by forming a first dielectric material which extends upward from said gate trench, and forming filaments of a second dielectric material on sidewalls of said first dielectric material.

3. The method of claim 2, wherein said first and second dielectric materials are the same.

4. The method of claim 1, wherein said first conductivity-type is n-type, and said second conductivity-type is p-type.

5. The method of claim 1, wherein said gate trench also penetrates a first-conductivity-type source layer which overlies said body layer.

6. The method of claim 1, wherein said gate trench also penetrates a first-conductivity-type source region which overlies said body layer, and wherein said body-contact trench contains conductive material that is also in contact with said source region.

7. The method of claim 1, wherein said additional dopant concentration region extends onto a junction formed between said body layer and said drift layer.

8. The method of claim 1, wherein said gate trench and said body-contact trench have different depths.

9. A method of fabricating a trench gate semiconductor field-effect transistor, comprising, in any order, the actions of:

fabricating a gate trench, through a first-conductivity-type source region and a second-conductivity-type body layer, toward a first-conductivity-type semiconductor drift layer; and forming a gate conductor, in said gate trench, which is capacitively coupled to at least part of said body layer; and also patterning a sacrificial layer to form openings above said respective gate trenches, forming respective pillars above said gate trenches, and removing said sacrificial layer;

forming respective sidewall spacers on ones of said pillars;

etching a body-contact trench into said body layer;

depositing conductive material into said body-contact trench to form a contact to said body layer;

wherein said gate trench and said body-contact trench are formed in a mutually self-aligned spatial relationship.

10. The method of claim 9, wherein said gate conductor comprises polysilicon.

11. The method of claim 9, wherein said contact to said body layer also makes contact to said source region.

12. The method of claim 9, wherein a dielectric layer is grown on sidewalls of said gate trench before said gate conductor is formed.

13. The method of claim 9, wherein said body contact trench is formed by forming a first dielectric material which extends upward from said gate trench, and forming filaments of a second dielectric material on sidewalls of said first dielectric material.

14. The method of claim 13, wherein said first and second dielectric materials are the same.

15. A method of fabricating a super self-aligned trench gate transistor, comprising, in any order, the actions of:

a) fabricating a gate trench and a recessed field plate (RFP) trench from a first surface down toward a semiconductor drift layer of a first-conductivity-type material;

said gate trench and recessed field plate trench spanning a second-conductivity-type body layer which overlies at least some parts of said drift layer; and, within said gate trench and said recessed field plate trench respectively, forming a gate conductor and a recessed field plate conductor respectively;

b) fabricating a body-contact trench from said first surface into said body layer;

and depositing conductive material into said body-contact trenches to form contact conductors which connect to said body layer; and c) fabricating a source electrode over the surface of said gate conductors and contact conductors, wherein said steps (a) and (b) form said gate trench and said body-contact trench in a mutually self-aligned spatial relationship.

16. The method of claim 15, wherein the step of fabricating said body contact trench is performed by forming a first dielectric material which extends upward from said gate trench, and forming filaments of a second dielectric material on sidewalls of said first dielectric material.

17. The method of claim 16, wherein said first and second dielectric materials are the same.

18. The method of claim 15, wherein said gate trench, the RFP trench and said body-contact trench are all of different depths.

19. The method of claim 15, wherein said gate trench has a step-shaped oxide.

20. The method of claim 15, wherein said gate trench is lined with dielectric, which is thicker at the bottom of said gate trench.

* * * * *